(12) United States Patent
Zhang et al.

(10) Patent No.: US 11,055,631 B2
(45) Date of Patent: Jul. 6, 2021

(54) AUTOMATED META PARAMETER SEARCH FOR INVARIANT BASED ANOMALY DETECTORS IN LOG ANALYTICS

(71) Applicant: NEC Laboratories America, Inc., Princeton, NJ (US)

(72) Inventors: Hui Zhang, Princeton Junction, NJ (US); Bo Zong, Plainsboro, NJ (US)

(73) Assignee: NEC Corporation

( * ) Notice: Subject to any disclaimer, the term of this patent is extended or adjusted under 35 U.S.C. 154(b) by 785 days.

(21) Appl. No.: 15/874,220

(22) Filed: Jan. 18, 2018

(65) Prior Publication Data
US 2018/0276566 A1 Sep. 27, 2018
US 2019/0197432 A9 Jun. 27, 2019

Related U.S. Application Data

(60) Provisional application No. 62/477,025, filed on Mar. 27, 2017.

(51) Int. Cl.
*G06N 20/00* (2019.01)
*G05B 23/02* (2006.01)
(Continued)

(52) U.S. Cl.
CPC ............. *G06N 20/00* (2019.01); *C07F 1/00* (2013.01); *C07F 1/08* (2013.01); *C07F 3/003* (2013.01); *C07F 3/02* (2013.01); *C07F 3/06* (2013.01); *C07F 5/003* (2013.01); *C07F 7/003* (2013.01); *C07F 7/28* (2013.01); *C07F 9/005* (2013.01); *C07F 11/005* (2013.01); *C07F 13/005* (2013.01); *C07F 15/0046* (2013.01); *C07F 15/025* (2013.01); *C07F 15/045* (2013.01);
(Continued)

(58) Field of Classification Search
CPC .............................. G06N 20/00; G06F 16/951
USPC ............. 706/12; 702/64; 707/603; 600/300; 714/38.1
See application file for complete search history.

(56) References Cited

U.S. PATENT DOCUMENTS 8,185,781 B2   5/2012  Chen et al.
8,495,429 B2*  7/2013  Fu ........................ G06F 11/3608
                                                            714/38.1
(Continued)

OTHER PUBLICATIONS

Marjan Momtazpour, Jinghe Zhang, Saifur Rahman, Ratnesh Sharma, and Naren Ramakrishnan. "Analyzing Invariants in Cyber-Physical Systems using Latent Factor Regression." In Proceedings of the 21th ACM SIGKDD International Conference on Knowledge Discovery and Data Mining, pp. 2009-2018. ACM, 2015.
(Continued)

*Primary Examiner* — Ruay Ho
(74) *Attorney, Agent, or Firm* — Joseph Kolodka

(57) ABSTRACT

Systems and methods for automatically generating a set of meta-parameters used to train invariant-based anomaly detectors are provided. Data is transformed into a first set of time series data and a second set of time series data. A fitness threshold search is performed on the first set of time series data to automatically generate a fitness threshold, and a time resolution search is performed on the set of second time series data to automatically generate a time resolution. A set of meta-parameters including the fitness threshold and the time resolution are sent to one or more user devices across a network to govern the training of an invariant-based anomaly detector.

14 Claims, 7 Drawing Sheets

(51) Int. Cl.
| | |
|---|---|
| *C23C 16/455* | (2006.01) |
| *G06N 5/04* | (2006.01) |
| *G06F 16/951* | (2019.01) |
| *C07F 1/00* | (2006.01) |
| *C07F 1/08* | (2006.01) |
| *C07F 3/00* | (2006.01) |
| *C07F 3/02* | (2006.01) |
| *C07F 3/06* | (2006.01) |
| *C07F 5/00* | (2006.01) |
| *C07F 7/00* | (2006.01) |
| *C07F 7/28* | (2006.01) |
| *C07F 9/00* | (2006.01) |
| *C07F 11/00* | (2006.01) |
| *C07F 13/00* | (2006.01) |
| *C07F 15/00* | (2006.01) |
| *C07F 15/02* | (2006.01) |
| *C07F 15/04* | (2006.01) |
| *C07F 15/06* | (2006.01) |
| *C23C 16/18* | (2006.01) |
| *H01L 21/02* | (2006.01) |

(52) U.S. Cl.
CPC ............ *C07F 15/065* (2013.01); *C23C 16/18* (2013.01); *C23C 16/45553* (2013.01); *G05B 23/0218* (2013.01); *G06F 16/951* (2019.01); *G06N 5/045* (2013.01); *H01L 21/02205* (2013.01)

(56) References Cited

U.S. PATENT DOCUMENTS

| | | | | |
|---|---|---|---|---|
| 2004/0128088 | A1* | 7/2004 | Laletin | H01M 6/5083 702/64 |
| 2010/0261977 | A1* | 10/2010 | Seely | G16H 15/00 600/300 |
| 2014/0310235 | A1* | 10/2014 | Chan | G06F 11/3003 707/603 |
| 2016/0350173 | A1* | 12/2016 | Ahad | G06F 11/3072 |
| 2017/0277997 | A1 | 9/2017 | Zong et al. | |
| 2018/0039898 | A1* | 2/2018 | Saini | G06F 21/554 |

OTHER PUBLICATIONS

Wei Cheng, Kai Zhang, Haifeng Chen, Guofei Jiang, Zhengzhang Chen, and Wei Wang. Ranking Causal Anomalies via Temporal and Dynamical Analysis on Vanishing Correlations. In Proceedings of the ACM SIGKDD International Conference on Knowledge Discovery and Data Mining (SIGKDD), 2016.

Xia Ning and Guofei Jiang. HLAer: A system for heterogeneous log analysis. In SDM Workshop on Heterogeneous Learning, 2014.

Guofei Jiang, Haifeng Chen, and Kenji Yoshihira. Efficient and Scalable Algorithms for Inferring Likely Invariants in Distributed Systems. IEEE Transactions on Knowledge and Data Engineering, 2007.

* cited by examiner

… (US 11,055,631 B2)

AUTOMATED META PARAMETER SEARCH FOR INVARIANT BASED ANOMALY DETECTORS IN LOG ANALYTICS

RELATED APPLICATION INFORMATION

This application claims priority to U.S. Provisional Patent Application No. 62/477,025, filed on Mar. 27, 2017, incorporated by reference herein in its entirety.

BACKGROUND

Technical Field

The present invention relates to invariant-based anomaly detectors, and more particularly to log analytics systems for training invariant-based anomaly detectors.

Description of the Related Art

A computer-generated record, referred to as a log or a log record, is data output generated from source code associated with a computer system component (e.g., network device, operating system, application and programmable devices) that documents activities performed by the computer system component. A log can include one or more lines of sentences that record system/application events or status at a time corresponding to a time stamp. Log analytics can be performed for a variety of practical applications, such as software debugging, compliance, computer system troubleshooting, forensics and investigations, security incident response and web analytics (e.g., search engine optimization).

SUMMARY

According to an aspect of the present principles, a computer-implemented method is provided for automatically generating a set of meta-parameters used to train invariant-based anomaly detectors. The method includes transforming, by a processor, data into a first set of time series data and a second set of time series data. The method further includes performing, by the processor, a fitness threshold search on the first set of time series data to automatically generate a fitness threshold, and a time resolution search on the set of second time series data to automatically generate a time resolution. The method further includes sending, by the processor to one or more user devices across a network, a set of meta-parameters including the fitness threshold and the time resolution to govern the training of an invariant-based anomaly detector.

According to another aspect of the present principles, a system is provided for automatically generating a set of meta-parameters used to train invariant-based anomaly detectors. The system includes a computer system configured to generate data including log data, and a processor operatively coupled to a memory. The processor is configured to obtain the data from the computer system and transform the obtained data into a first set of time series data and a second set of time series data. The processor is further configured to perform a fitness threshold search based on the first set of time series data to automatically generate a fitness threshold, and a time resolution search on the second set of time series data to automatically generate a time resolution. The processor is further configured to send, to one or more user devices across a network, a set of meta-parameters including the fitness threshold and the time resolution to govern the training of an invariant-based anomaly detector.

According to yet another aspect of the present principles, a computer program product having program instructions embodied therewith is provided. The program instructions are executable by a computer to cause the computer to perform a method for automatically generating a set of meta-parameters used to train invariant-base anomaly detectors. The method includes transforming data into a first set of time series data and a second set of time series data. The method further includes performing a fitness threshold search on the first set of time series data to automatically generate a fitness threshold, and a time resolution search on the set of second time series data to automatically generate a time resolution. The method further includes sending, to one or more user devices across a network, a set of meta-parameters including the fitness threshold and the time resolution to govern the training of an invariant-based anomaly detector.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
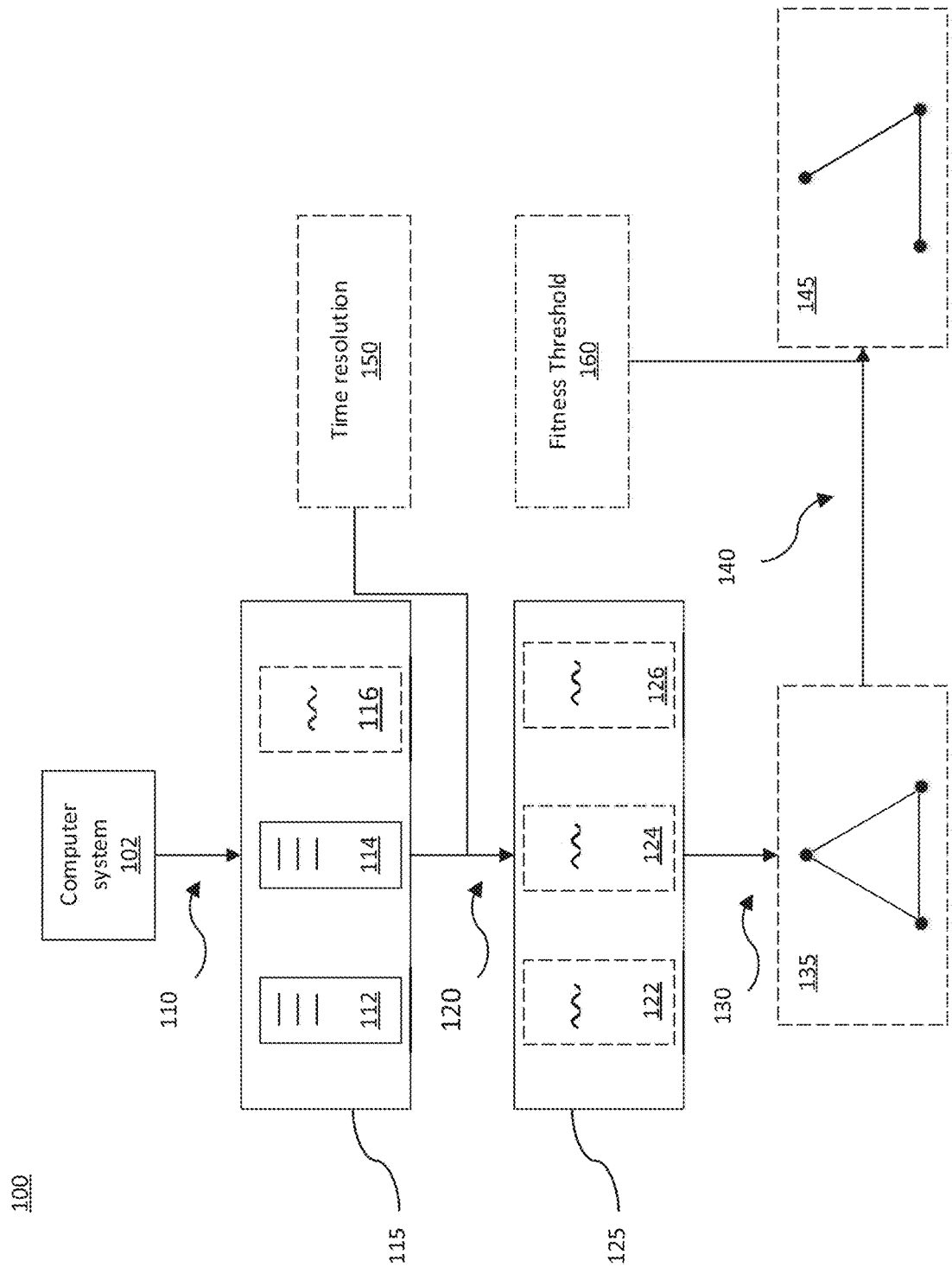
FIG. 1 is a block/flow diagram illustrating a system/method for training an invariant-based anomaly detector, in accordance with the present principles.

One field that log analytics system can be used for is in the realm of anomaly detection. In the fields of data mining and machine learning, anomaly detection refers to the identification of items, events or observations which do not conform to an expected pattern or other items in a dataset. That is, anomaly detectors detect data that does not fit well with a dataset. Anomalies typically are associated with some sort of error or problem, or a rare occurrence of a particular data point. Anomaly detection techniques can be applied to a vast number of real-world scenarios, including but not limited to fraud detection, surveillance, diagnosis, data cleanup and predictive maintenance. Log analysis systems can automatically process logs from large complex systems and can detect anomalies as indicators in diagnosing potential system problems and/or failures.

Generally, an invariant is a relationship among data that is expected to be maintained under normal conditions. In the context of log data, invariants can be viewed relationships among log data that are expected to be maintained under normal operating conditions of a computer system. Thus, invariants can be used to model system behavior (e.g., at runtime), and violations of such invariant relationships can be used to detect system anomalies.

An anomaly detector, such as an invariant-based anomaly detector, can be implemented in two phases: (1) training and (2) testing. Generally, in the training phase of an invariant-based anomaly detector, invariants among data are learned. In the testing phase of an invariant-based anomaly detector, the learned invariants are employed as anomaly detectors.

In one embodiment, the invariant-based anomaly detector is an invariant-based log anomaly detector. In the training phase of an invariant-based log anomaly detector, log data can be transformed into time series data, and invariants among the log data can be learned by performing an analysis over the time series data. Each of the invariants may indicate the correlation between a pair of time series. Thus, in the testing phase, the learned invariants are employed as log anomaly detectors. Accordingly, anomalies can be discovered when a correlation between two of the time series has a substantial deviation from the learned invariants.

The training phase to learn the invariants of the log data can be governed by a set of meta-parameters, including time resolution and fitness threshold. The time resolution decides the frequency of time series used in the model training (e.g., the time resolution decides the input data for training), and the fitness threshold decides which invariants will be reserved for the anomaly detectors (e.g., the fitness threshold decides how to filter out weak invariants).

In order to achieve optimal performance during the training phase, optimal values of the time resolution and the fitness threshold should be chosen. However, in real-life applications, it can be difficult for users to manually tune the time resolution and/or the fitness threshold. For example, users may not have enough domain knowledge to make such a decision. Additionally, a naïve brute-force meta-parameter search may be unfeasible, especially when the size of the training data is large. Accordingly, manually choosing a set of meta-parameters for training invariant-based anomaly detectors, such as invariant-based log anomaly detectors, can be a daunting task, especially for users who do not have enough domain knowledge.

To this end, the embodiments described herein provide for a system and method for automatically generating a set of meta-parameters for training invariant-based anomaly detectors, such as invariant-based log anomaly detectors, by identifying a particular combination of meta-parameters (e.g., a combination of time resolution and fitness threshold) with empirically acceptable performance. The meta-parameters that are automatically generated can be used as a recommended setting for training invariant-based anomaly detectors. By automating the process for discovering such meta-parameters, increased computational efficiency for training invariant-based anomaly detectors is achieved.

The embodiments described herein are particularly useful for users who do not have enough domain knowledge to execute a meta-parameter search. Moreover, for users who can tune such meta-parameters, the recommended meta-parameters can function as a starting point for further meta-parameter exploration. Accordingly, the meta-parameters automatically generated in accordance with the embodiments described herein can substantially reduce the complexity of training and utilizing invariant-based anomaly detectors in real-world applications.

Referring now in detail to the figures in which like numerals represent the same or similar elements and initially to FIG. 1, a system/method 100 for training an invariant-based anomaly detector is illustratively depicted in accordance with one embodiment of the present principles.

Although the illustrative embodiments will be described herein within the context of training invariant-based log anomaly detectors for detecting anomalies within log data, any type of invariant-based anomaly detector for detecting anomalies within any type of data can be trained in accordance with the embodiments described herein.

As shown, a computer system 102 outputs log data 115 at a first phase 110. In one embodiment, the log data 115 is generated by one or more components of the computer system 102. For example, the log data may include heterogeneous log data. Heterogeneous log data refers to log data obtained from different sources, whereas homogenous log data refers to log data obtained from the same source. Heterogeneous log data can have different formats, different purposes and/or different content. In this illustrative embodiment, the log data 115 can include mail server logs 112, database (DB) server logs 114, and CPU usage 116.

The log data 115 can include training data utilized to train the invariant-based anomaly detector. In one embodiment, the training includes a plurality of phases, including phase 120, phase 130 and phase 140.

Phase 120 includes time series alignment. During phase 120, the log data 115 is transformed into a set of time series data 125. For example, in this illustrative embodiment, the mail server logs 112, the DB server logs 114 and CPU usage 116 are transformed into mail server log time series data 122, DB server log time series data 124 and CPU usage time series data 126, respectively.

As shown, phase 120 is governed by a time resolution 150. The time resolution 150 defines the frequency of the time series data being output during the transformation. For example, if the time resolution 150 is set to 60 seconds, a sample point will be drawn every 60 seconds for the output set of time series data 125. Accordingly, different settings for the time resolution 150 will generate different time series data included in the set of time series data 125.

During phase 130, an invariant analysis generates a set of all-pair invariants 135 for the set of time series data 125. In one embodiment, the invariant analysis includes a correlation analysis. For example, in this illustrative embodiment, the invariant analysis is performed on the time series data 122-126 within the set of time series data 125 to generate a fully-connected graph that includes nodes corresponding to the mail server log time series data 122, the DB server log time series data 124, and the CPU usage time series data 126.

During phase 140, a set of filtered invariants 145 is generated from the set of all-pair invariants 135. The set of filtered invariants 145 represents a collection of invariants that can be used for invariant-based anomaly detection. For example, as shown in this illustrative embodiment, the set of filtered invariants 145 includes the nodes from the set of all-pair invariants 135, except that two of the nodes are not connected. Illustratively, the nodes corresponding to the mail server log time series data 122 and the DB serve log time series data 124 are not connected.

As shown, phase 140 is governed by a fitness threshold 160. The fitness threshold 160 controls the tradeoff between a false positive rate and true anomaly coverage in invariant-based anomaly detectors by filtering out invariants whose fitness is less than the fitness threshold 160. A higher value for the fitness threshold 160 corresponds to a detector having a lower false positive rate and a lower true anomaly coverage, while a lower value for the fitness threshold 160 corresponds to a detector having a higher false positive rate and a higher true anomaly coverage.

Figure 2:
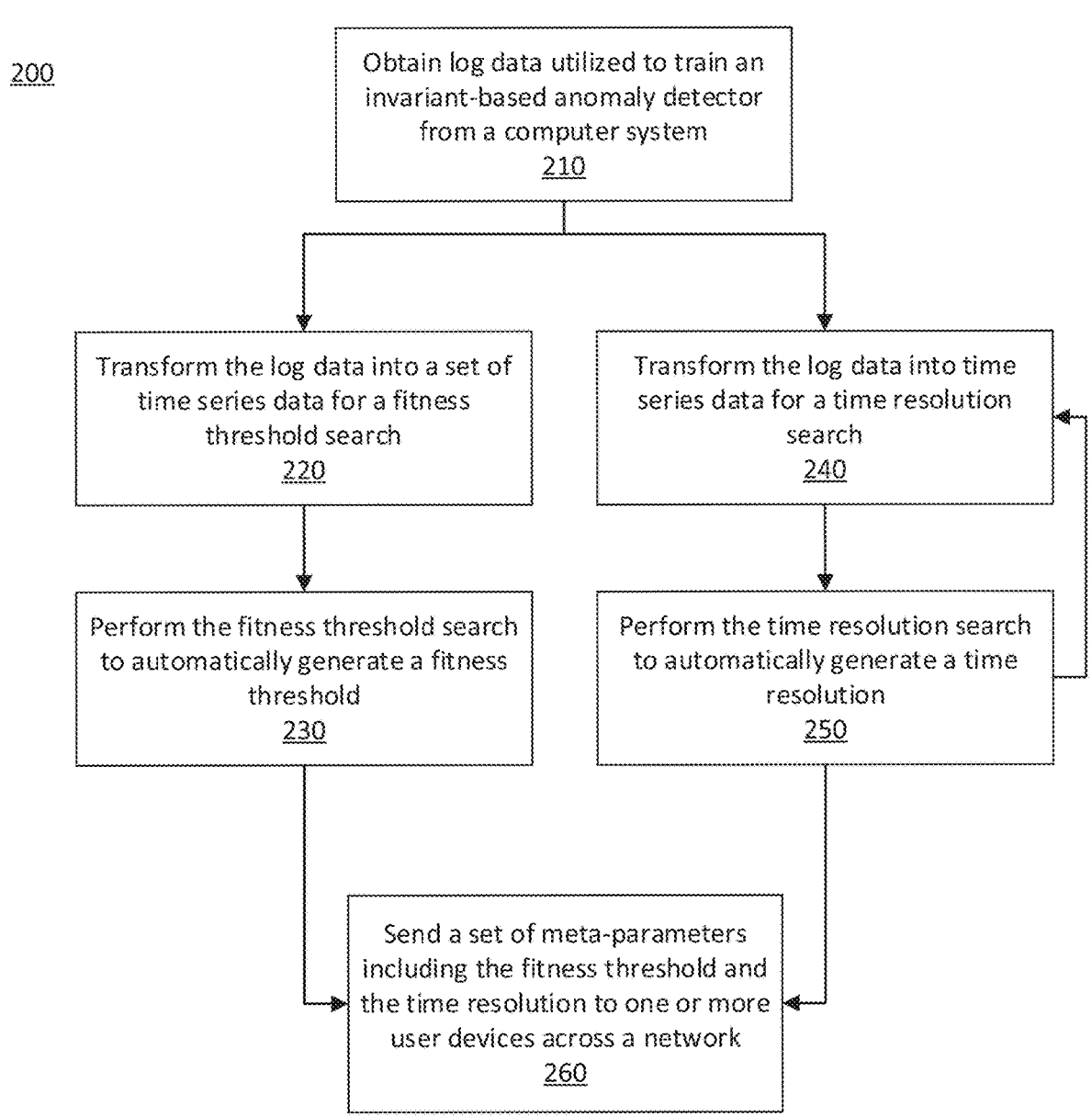
FIG. 2 is a block/flow diagram illustrating a system/method for automatically generating meta-parameters for invariant-based anomaly detectors, in accordance with the present principles.

Referring now to FIG. 2, a block/flow diagram illustrating a system/method 200 for automatically generating meta-parameters for invariant-based anomaly detectors is illustratively depicted in accordance with one embodiment of the present principles.

At block 210, log data utilized to train an invariant-based anomaly detector is obtained from a computer system. In one embodiment, the log data includes heterogeneous log data generated by the computer system.

For example, the log data may include text logs. Text logs can include one or more lines of text log messages. Typically, such text logs are grouped into clusters based on their structural similarity, and are then transformed into tuples having a format (C, f, t), where C is the cluster identifier (id), t is a timestamp, and f is the number of log messages from the cluster C occurring at time t.

As another example, the log data can include performance logs. The performance logs record numerical readings from sensors, such as CPU usage in computer networks, humidity in environment monitoring, etc. Such performance logs are usually represented by time series with time resolutions pre-defined by individual sensors.

At block 220, the log data is transformed into a set of time series data for a fitness threshold search. Here, the log data (e.g., text and/or performance logs) is received as input, and a set of time series data for a later fitness threshold search is output. In one embodiment, given a time resolution $T_{ft}$, time series alignment is used to merge the log data into a set of time series data with the same frequency. As mentioned previously, $T_{ft}$ defines the frequency of the time series data being output during the transformation. For example, if $T_{ft}$ is set to 60 seconds, a sample point will be drawn every 60 seconds for the output time series data. Accordingly, the choice of $T_{ft}$ affects the output set of time series data. Further details regarding block 220 will now be provided with reference to FIG. 3.

Figure 3:
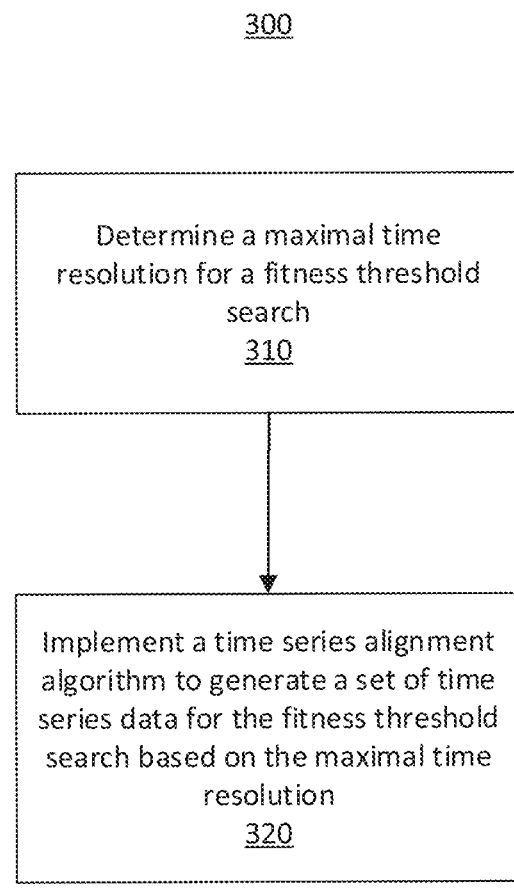
FIG. 3 is a block/flow diagram illustrating a system/method for transforming log data into a set of time series data for a fitness threshold search, in accordance with the present principles.

Referring now to FIG. 3, a block/flow diagram illustrating a system/method 300 for transforming log data into a set of time series data for a fitness threshold search is illustratively depicted in accordance with one embodiment of the present principles.

At block 310, a maximal time resolution, $T_{ft}$, for a fitness threshold search is determined. Here, we have no prior knowledge about time resolution selection. In order to determine a suitable fitness threshold during the fitness threshold search, a time resolution that preserves the most pairwise correlation with acceptable model robustness is needed.

To determine $T_{ft}$, the following observations are made. First, invariant analysis requires a minimal number of sample points in time series data, M, for minimal robustness. Moreover, for two time resolutions $T_1$ and $T_2$ with $T_1 < T_2$, the time series generated by $T_2$ will have less variance than the time series generated by $T_1$. In terms of linear correlation in invariants, the fitness of invariance with respect to $T_2$ is more likely to be higher than its counterpart with respect to $T_1$. Such total order has no deterministic guarantee unless $T_1$ is a common divisor of $T_1$ and $T_2$. Therefore, to ensure such total order, the choice of time resolution is constrained into a subset of integers $T = \{T | T = B2^k, k = 0, 1, 2, \ldots \}$ (where B is a base integer, e.g., B=15) so that any $T_1$ and $T_2$ in T with $T_1 < T_2$, $T_1$ is a common divisor of $T_1$ and $T_2$.

Based on the above observations, $T_{ft}$ is determined to be an integer within the set T that provides at least M sample points for time series data for a fitness threshold search. Accordingly, $T_{ft}$ is the time resolution that meets model robustness and provides the most relax linear correlation evaluation.

In one embodiment, $T_{ft}$ is determined in the following manner. Given training data spanning from timestamp $t_1$ to $t_2$, the number of seconds covered is $t_2 - t_1$. Suppose any $T_i$ in T is an integer at the granularity of seconds. The number of sample points is equal to $$\frac{t_2 - t_1}{B2^k}.$$

Accordingly, the problem of finding $T_{ft}$ becomes equivalent to the problem of finding a maximum k such that $$\frac{t_2 - t_1}{B2^k} \geq M.$$

Any techniques may be used to find the maximum k, in accordance with the embodiments described herein. In one embodiment, finding the maximum k includes implementing binary search.

At block 320, time series alignment is used to generate the set of time series data for the fitness threshold search. The set of time series data includes time series data having the same frequency across the log data.

Referring back to FIG. 2, at block 230, the fitness threshold search is performed to automatically generate a fitness threshold. The fitness threshold search can be designed as a combinatorial optimization problem, in which the fitness threshold is chosen from a finite set of values. Further details regarding block 230 will now be provided with reference to FIG. 4.

Figure 4:
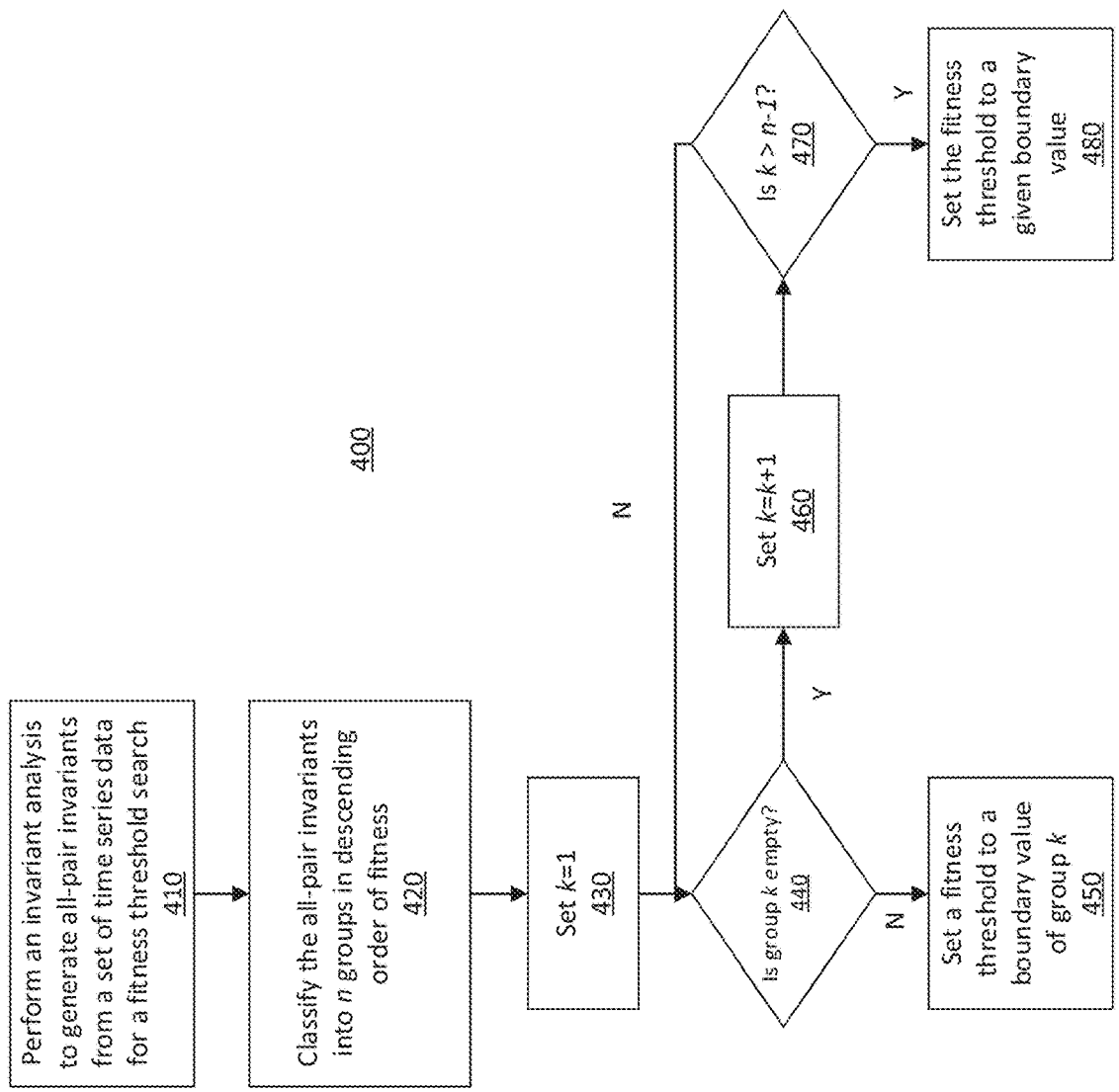
FIG. 4 is a block/flow diagram illustrating a system/method for performing a fitness threshold search to automatically generate a fitness threshold, in accordance with the present principles.

Referring now to FIG. 4, a block/flow diagram illustrating a system/method 400 for performing a fitness threshold search to automatically generate the fitness threshold is illustratively depicted in accordance with one embodiment of the present principles.

At block 410, an invariant analysis is performed to generate all-pair invariants from a set of time series data for a fitness threshold search. In one embodiment, one or more invariant analysis tools are used to generate the all-pair invariants. Each invariant is generated with a corresponding fitness. In one embodiment, a set of time series data is generated in accordance with a maximal time resolution $T_{ft}$.

To design a reasonable combinatorial optimization problem for performing the fitness threshold search to automatically generate the fitness threshold, it is observed that invariants of higher fitness are preferred for invariant-based anomaly detectors, and that as long as an invariant with acceptable fitness exists, it would be better to recommend a non-empty anomaly detector with at least one invariant for further interactive model tuning. Moreover, while it is difficult to decide how many invariants one may need to build an invariant-based anomaly detector, it is relatively simpler to classify invariants into groups based on their fitness, and select a strongest one of the groups.

Thus, at block 420, the all-pair invariants are classified into n groups based on fitness. Without loss of generality, the n groups are organized in descending order of fitness, such that a first group may correspond to the highest fitness group, and a last group may correspond the lowest fitness group. The all-pair invariants in the lowest fitness group (e.g., the last group) are ignored since they do not have a sufficiently high fitness value for purposes of performing the fitness threshold search.

Each of the n groups has a lower fitness bound defined by a respective boundary value. For example, a lower fitness bound of the first group can be defined by a first boundary value, a lower fitness bound of a second group can be defined by a second boundary value less than the first boundary value, a lower fitness bound of a third group can be defined by a third boundary value less than the second boundary value, . . . , and a lower fitness bound of the last group can be defined by a boundary value of 0.

The fitness threshold may then be defined as the largest boundary value that returns a non-empty group of acceptable invariants.

For example, at block 430, a counter k is set to 1 and at block 440, it is determined if the first group (the highest fitness group) is empty. If not, the fitness threshold is set as the largest boundary value (e.g., the first boundary value) at block 450 and the search terminates.

However, if the first group is empty, the counter k is updated to k+1 at block 460, and it is determined if k>n−1 at block 470. If not, it is determined if group k is empty at block 440.

If it is determined that k>n−1, this implies that all the groups associated with invariants having a sufficiently high fitness value are empty, since the last (n-th) group is the lowest fitness group. Thus, there are no remaining groups left to check, since the last group is being ignored for purposes of performing the fitness threshold search. Thus, the fitness threshold is set to a given value at step 480. In one embodiment, the given value is the largest boundary value (e.g., the boundary value of the first group).

For the sake of illustrating how blocks 410-480 operate, the invariants may be classified into four groups, such that the first group is associated with the highest fitness and the fourth group is associated with the lowest fitness. For example, the first group can include invariants having a fitness greater than or equal to a first boundary value of 0.7, the second group can include invariants having a fitness greater than or equal to a second boundary value 0.5 (but less than the first boundary value 0.7), the third group can include invariants having a fitness greater than or equal to a third boundary value of 0.2 (but less than the second boundary value of 0.5), and the fourth group that can include invariants having a fitness greater than or equal to a fourth boundary value of 0 (but less than the third boundary value of 0.2). Accordingly, in this illustrative embodiment, only invariants having a fitness of at least 0.2 are treated as acceptable, while invariants having a fitness less than 0.2 are ignored.

It is determined if the first group is empty. If the first group is not empty, then the fitness threshold is set to 0.7, which is the boundary value of the first group. If the first group is empty, it is determined if the second group is empty. If the second group is not empty, then the fitness threshold is set to 0.5, which is the boundary value of the second group. If the second group is empty, it is determined if the third group is empty. If the third group is not empty, then the fitness threshold is set to 0.2, which is the boundary value of the third group. Since the fourth group is being excluded for purposes of generating the fitness threshold, if the third group is empty, that means that no acceptable invariants exist (e.g., invariants with a sufficiently high fitness value). Thus, the fitness threshold is set to a given value which can illustratively be the boundary value of the first group (0.7).

It is to be appreciated that the number of groups chosen in this illustrative example, namely four groups, and the boundary values of the groups chosen in this illustrative example, namely 0.2, 0.5 and 0.7, are purely exemplary. The number of groups and the values of the groups can be customized based on user-need. Accordingly, this illustrative embodiment should not be considered limiting.

Referring back to FIG. 2, at block 240, the log data is transformed into a set of time series data for a time resolution search. Here, the log data (e.g., text and/or performance logs) is received as input, and a set of time series data for a later time resolution search is generated as output. Unlike at block 220, the transformation at block 240 is an iterative procedure. For example, at the beginning, T is set as a pre-defined integer, and the value of T will change based on the results of the time resolution search performed at block 250 to automatically generate a time resolution. In one embodiment, combinatorial optimization is iteratively performed to automatically generate the time resolution. Accordingly, the results from block 250 may be fed back as input into block 240 to determine a choice of T.

Figure 5:
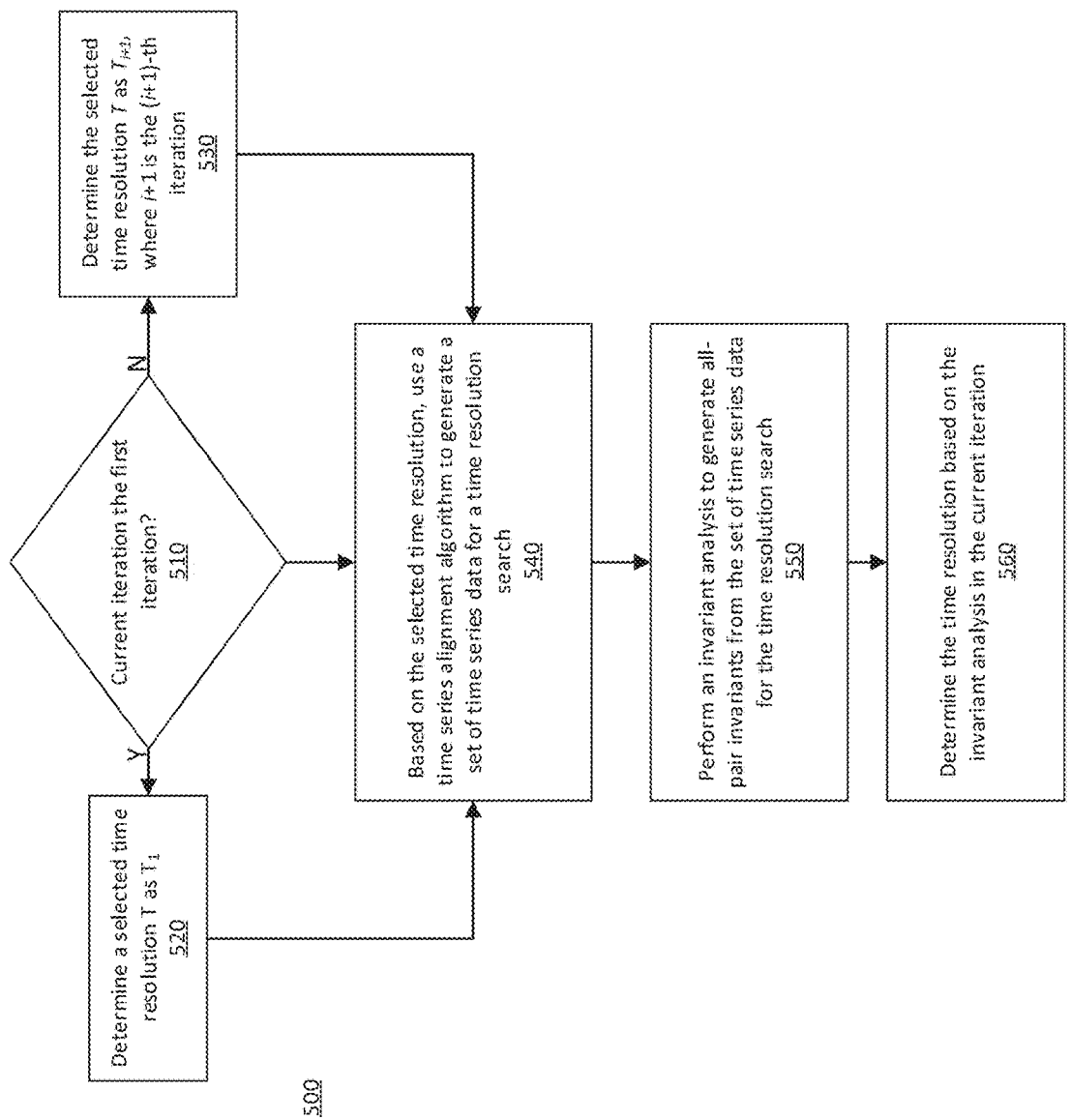
FIG. 5 is a block/flow diagram illustrating a system/method for transforming log data into a set of time series data for a time resolution search, and performing the time resolution search to automatically generate a time resolution, in accordance with the present principles.

Further details regarding blocks 240 and 250 will now be provided with reference to FIG. 5.

Referring now to FIG. 5, a block/flow diagram illustrating a system/method 500 for transforming log data into a set of time series data for a time resolution search, and performing the time resolution search to automatically generate a time resolution, is illustratively depicted in accordance with one embodiment of the present principles.

Blocks 510-540 collectively transform log data into a set of time series data for a time resolution search, in accordance with an illustrative embodiment. As mentioned above in FIG. 2, the transformation of the log data into the set of time series data for a time resolution search is an iterative procedure.

At block 510, it is determined if a current iteration is the first iteration.

If so, the time resolution is selected as $T_1$ at block 520. In one embodiment, $T_1 = B2^{k_{max}}$, where $k_{max}$ is the maximum non-negative integer that satisfies $$\frac{\Delta t}{B2^{k_{max}}} \geq 100,$$

and where $\Delta t$ is the number of seconds covered by the training data.

If the current iteration is not the first iteration, then the current iteration can be represented as the (i+1)-th iteration, where i>0, and the time resolution of the current iteration is selected as $T_{i+1}$ at block 530. In one embodiment, if the time resolution in the i-th iteration is defined as $T_i = B2^{k_i}$, where $k_i > 0$, then the time resolution in the (i+1)-th iteration is $T_{i+1} = B2^{k_{i+1}}$, wherein B is a base integer (e.g., B=15) and $k_{i+1} = k_i - 1$.

At block 540, based on the selected time resolution, time series alignment is used to merge log data into a set of time series data for a time resolution search. The time series data in the set has the same frequency.

Blocks 550 and 560 collectively perform the time resolution search, in accordance with an illustrative embodiment.

At block 550, an invariant analysis is performed based on the set of time series data for the time resolution search. In one embodiment, one or more invariant analysis tools are used to generate the all-pair invariants. The invariant analysis is performed to generate all-pair invariants along with their fitness.

At block 560, the time resolution is generated based on the invariant analysis in the current iteration. Here, the fitness threshold (e.g., the fitness threshold discovered at block 103 in FIG. 1) is used to filter out weak invariants. For example, let $T_i$ be a time resolution and S be the set of invariants generated under $T_i$ and have a fitness no less than the fitness threshold. Two time resolutions $T_i$ and $T_j$ are determined to be equivalent if their respective sets of invariants $S_i$ and $S_j$ are identical.

If the current iteration is the first iteration, then a baseline invariant set is defined by $S_1$.

However, if the current iteration is the (i+1)-th iteration, it is determined whether $S_{i+1}$ is equivalent to $S_1$. If they are equivalent and $T_{i+1} > B$, then another iteration of transforming the log data into time series data for the time resolution is performed. Otherwise, the time resolution can be defined as $2T_{i+1}$.

Accordingly, the automatically generated time resolution is the smallest time resolution that preserves the invariant set discovered at the most relaxed time resolution $T_1$.

Referring back to FIG. 2, at block 260, a set of meta-parameters, including the fitness threshold and the time resolution, can be sent to one or more user devices over a network. The set of meta-parameters received by the one or more user devices can subsequently be used in real-world applications of invariant-based anomaly detectors.

Accordingly, the embodiments described herein provide for computer-automated meta-parameter generation for invariant-based anomaly detectors.

Embodiments described herein may be entirely hardware, entirely software or including both hardware and software elements. In a preferred embodiment, aspects of the present invention are implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

Each computer program may be tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 6:
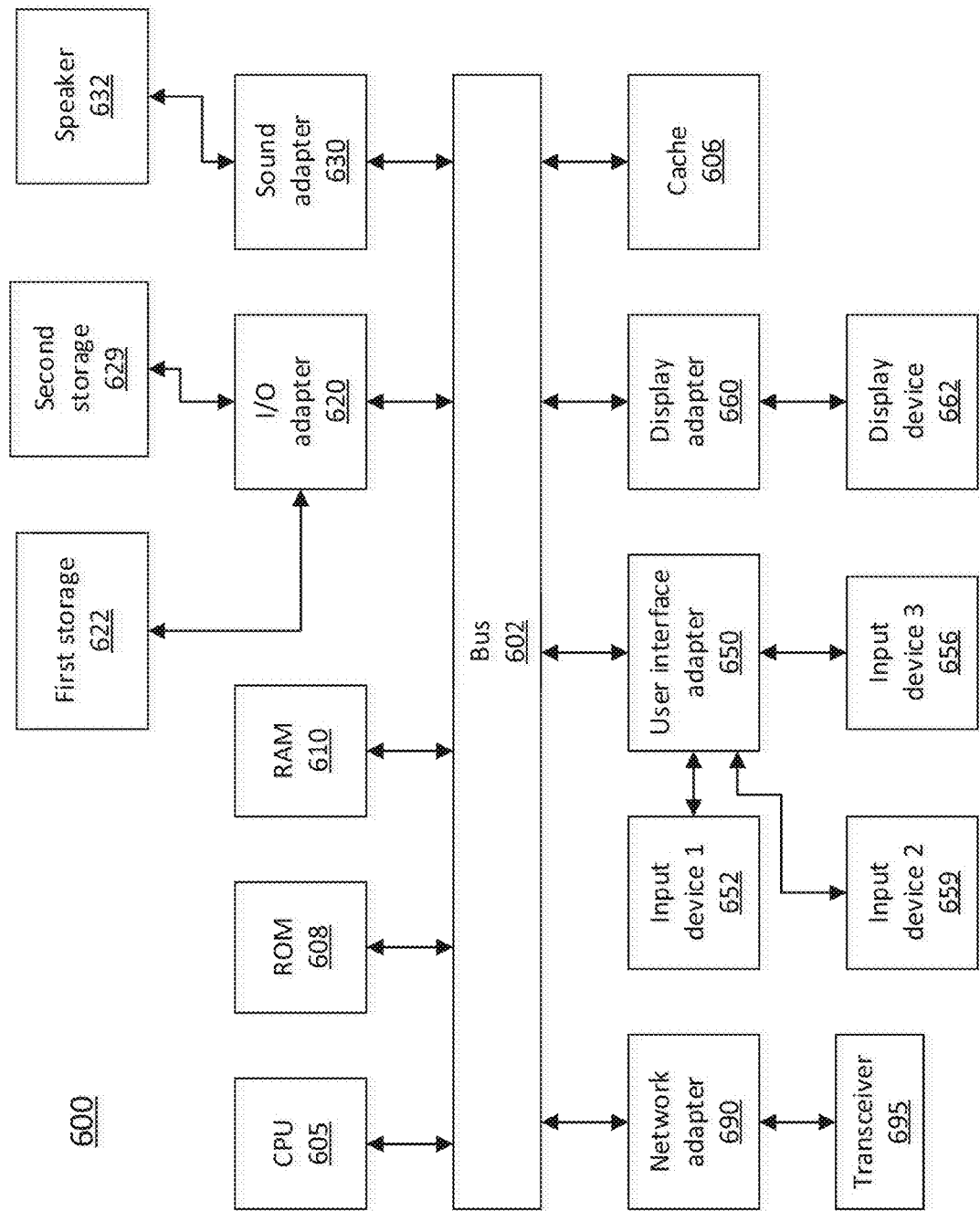
FIG. 6 is a block/flow diagram illustrating a computer system, in accordance with the present principles.

Referring now to FIG. 6, an exemplary computer system 600 is shown which may represent a server or a network device, in accordance with an embodiment of the present invention. The computer system 600 includes at least one processor (CPU) 605 operatively coupled to other components via a system bus 602. A cache 606, a Read Only Memory (ROM) 608, a Random-Access Memory (RAM) 610, an input/output (I/O) adapter 620, a sound adapter 630, a network adapter 690, a user interface adapter 650, and a display adapter 660, are operatively coupled to the system bus 602.

A first storage device 622 and a second storage device 629 are operatively coupled to system bus 602 by the I/O adapter 620. The storage devices 622 and 629 can be any of a disk storage device (e.g., a magnetic or optical disk storage device), a solid state magnetic device, and so forth. The storage devices 622 and 629 can be the same type of storage device or different types of storage devices.

A speaker 632 may be operatively coupled to system bus 602 by the sound adapter 630. A transceiver 695 is operatively coupled to system bus 602 by network adapter 690. A display device 662 is operatively coupled to system bus 602 by display adapter 660.

A first user input device 652, a second user input device 659, and a third user input device 156 are operatively coupled to system bus 602 by user interface adapter 650. The user input devices 652, 659, and 656 can be any of a sensor, a keyboard, a mouse, a keypad, a joystick, an image capture device, a motion sensing device, a power measurement device, a microphone, a device incorporating the functionality of at least two of the preceding devices, and so forth. Of course, other types of input devices can also be used, while maintaining the spirit of the present invention. The user input devices 652, 659, and 656 can be the same type of user input device or different types of user input devices. The user input devices 652, 659, and 656 are used to input and output information to and from system 600.

Of course, the computer system 600 may also include other elements (not shown), as readily contemplated by one of skill in the art, as well as omit certain elements. For example, various other input devices and/or output devices can be included in computer system 600, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the computer system 600 are readily contemplated by one of ordinary skill in the art given the teachings of the present invention provided herein.

As mentioned previously, anomaly detectors can be used to detect anomalies with respect to a vast number of real-world scenarios, including but not limited to fraud detection, surveillance, diagnosis, data cleanup and predictive maintenance. Accordingly, an invariant-based anomaly detector trained utilizing the set of meta-parameters generated in accordance with the embodiments described herein can be used to detect such anomalies.

For example, an invariant-based log anomaly detector trained in accordance with the set of meta-parameters can detect anomalies as indicators in diagnosing potential system problems and/or failures. Failure diagnosis is the process of discovering the root cause of occurred failures based on a set of observed failure indications in the computer system. Fast and accurate diagnosis is essential to maintain the high availability of current computing systems. Most distributed transaction computer systems, such as Internet services, employ multi-tier architectures to integrate their components.

Figure 7:
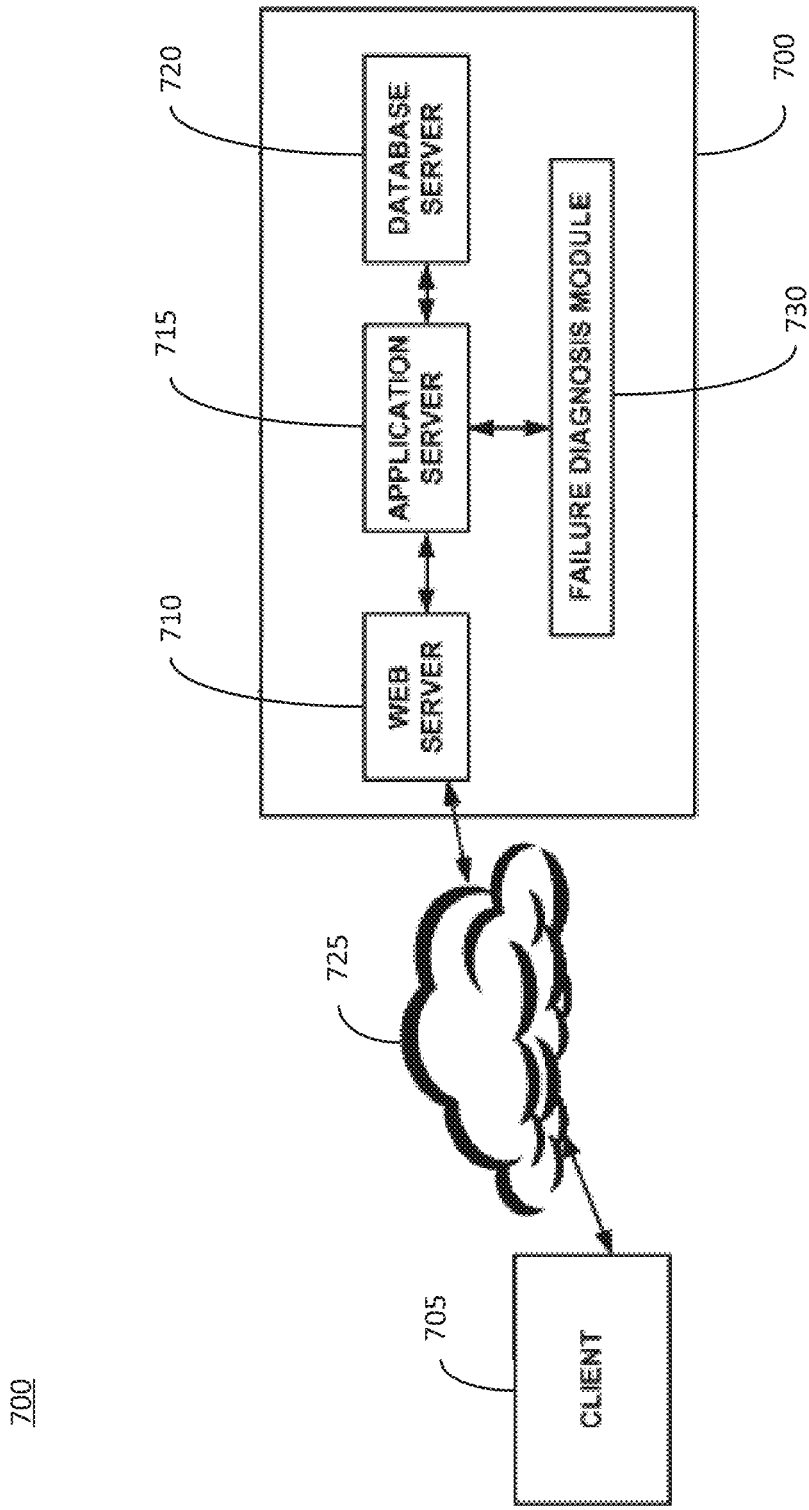
FIG. 7 is a block/flow diagram illustrating an exemplary distributed computer system for implementing invariant-based failure diagnosis, in accordance with the present principles.

Referring to FIG. 7, an exemplary embodiment of a computer system, illustratively depicted as a distributed system (e.g., distributed transaction system) 700, that supports failure diagnosis is provided. The distributed system 700 illustratively includes a three-tier architecture that contains a web tier having one or more web servers 710, a middleware tier having one or more application servers 715, and a database tier having one or more database servers 720. One or more individual client computers 705 at a plurality of locations can communicate with the web servers 710 via a communication network 725, such as the Internet. The one or more web servers 710 communicate with other servers, such as the one or more application servers 715 and the one or more database servers 720.

The one or more web servers 710 operate as an interface, or gateway, to present data to the browser of the one or more client computers 705. The one more application servers 715 support specific business, or application logic for various applications, which generally includes the bulk of an application. The one or more database servers 720 are used for data storage.

The distributed system 700 further includes a failure diagnosis module 730 for diagnosing failures on the distributed system 700. In one embodiment, an invariant-based learning process or method is performed on the distributed system 700 to diagnose failures in the distributed system 700.

The failure diagnosis module 730 can be executed on one or more of the web, application, and database servers 710, 715, 720. Alternatively, the failure diagnosis module 730 can be executed on its own server or computer (not shown).

One of ordinary skill in the art will appreciate that the invariant-based learning process for failure diagnosis can be applied to distributed systems having other types of components and tiers.

The web, application, and database servers 710, 715, and 720 of the distributed system 700 can be built from a number of software packages running on servers (computers) which provide similar functionality. For example, such software packages can include, without limitation, Apache and IIS for the web servers 710, WebLogic and WebSphere for the applications server 715, and Oracle and DB2 for the database servers 720.

During operation, the distributed system 700 can produce large amounts of monitoring data, such as log data (e.g., log files), to track its operational status. In accordance with the embodiments described herein, this data is measured from the various components of the distributed system 700, i.e., the web, application and data servers 710, 715 and 120, the client computers 705, the system networks, and from the application workloads. CPU usage, network traffic volume, and number of SQL queries are non-limiting examples of monitoring data that may be measured. Measurements of various resource utilizations can be obtained from the web, application and data servers 710, 715 and 720 and the client computers 705, such as CPU, memory, and disk utilizations. Measurements about network packets can be obtained from the networks of the distributed system. System workload measurements can be obtained as the number of user requests entering the distributed system. User requests traverse a set of the system components and software paths according to application logic. Much of the internal monitoring data of the distributed system reacts to the volume of user requests.

While a large volume of user requests flow through various components in the distributed system 700, many resource consumption related measurements respond to the intensity of user loads, accordingly. Therefore, flow intensity, as used herein, refers to the intensity with which internal measurements respond to the volume of (i.e., number of) user loads. Based on this definition of flow intensity, constant relationships between two flow intensities can be determined at various points across the distributed system 700 in accordance with the present disclosure. If a constant relationship between two flow intensity measurements always hold true under various workloads over time, this relationship is referred to herein as a pair-wise invariant or pair-wise invariant model of the distributed system 700.

The failure diagnosis module 730 extracts the status of system invariants and then uses them to reflect the failure behavior. Such representation not only captures suspicious system attributes but also their correlation changes during the failure. Furthermore, the temporal behavior of the failure is also included in the signature by combining a sequence of observations along the failure time. The invariants of the distributed system can be extracted by the failure diagnosis module 730 using any known technique in accordance with the embodiments described herein.

When a failure occurs in the distributed system 700, a sequence of broken invariants is recorded by the failure diagnosis module 730 in a binary vector to represent the failure behavior. In one embodiment, spatial and temporal evidences about the failure are embedded into the signature. As a result, a more accurate representation of system failures can be achieved, especially when the failure observations are noisy. With such failure signature representation, a database is created to store all historical failures, as well as the historical failures' annotations. Failure diagnosis is performed by searching for similar failures in the database so that previous experiences about failure recovery can be reused. In one embodiment, a metric is disclosed herein for describing the similarity between two failure signatures. The metric compares failure signatures by considering the number of common broken invariants as well as the union of broken invariants in the signatures. This metric can lead to better differentiations between various failure types. Efficient search techniques are also disclosed herein to speed-up the signature retrieval from the database. In one embodiment, several predefined signature templates are used to index the historical failures to accelerate failure retrieval, by computing the distances between all historical failures and the templates offline. Given a query signature, distances from the query signature to the predefined signature templates are computed. Based on those distances, an inference is made about the location of the query signature in the database. As a result, many irrelevant failures in the database can be ruled out, and the actual search can be limited to a small number of potential candidates. With this method, an almost constant number of signature comparisons can be achieved even when the failure database increases.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A computer-implemented method for automatically generating a set of meta-parameters used to train invariant-based anomaly detectors, comprising:
   transforming, by a processor, data into a first set of time series data and a second set of time series data;
   performing, by the processor, a fitness threshold search based on the first set of time series data to automatically generate a fitness threshold;
   performing, by the processor, a time resolution search on the second set of time series data to automatically generate a time resolution; and
   sending, by the processor to one or more user devices across a network, a set of meta-parameters including the fitness threshold and the time resolution to govern the training of an invariant-based anomaly detector,
   wherein, in transforming the data into the first set of time series data, the processor is further configured to:
   determine a maximal time resolution for the fitness threshold search; and
   use time series alignment to generate the first set of time series data based on the maximal time resolution;
   wherein the determination of the maximal time resolution comprises, given data spanning from a timestamp $t_1$ to a timestamp $t_2$, a determination of a maximum k such that $$\frac{t_2 - t_1}{B2^k} \geq M,$$

where B is a base integer and M is a user-set minimal number of sample points.

2. The method as recited in claim 1, wherein the data includes log data generated by a computer system.

3. The method as recited in claim 2, wherein the log data includes text logs.

4. The method as recited in claim 2, wherein the log data includes performance logs.

5. The method as recited in claim 1, wherein performing the fitness threshold search to automatically generate the fitness threshold further comprises:
   performing an invariant analysis to generate all-pair invariants from the first set of time series data;
   classifying the all-pair invariants into groups based on a fitness of each all-pair invariant, wherein each of the groups has a lower bound defined by a boundary value, and wherein the groups are organized in descending order of fitness such that a first one of the groups has a lower bound defined by a highest boundary value and a last one of the groups has a lower bound defined by a boundary value of zero;
   determining that at least one of the groups, excluding the last group, is non-empty; and
   setting the fitness threshold to a boundary value corresponding to the non-empty group having the highest boundary value.

6. The method as recited in claim 1, wherein transforming the data into the second set of time series data further comprises:
   determining a selected time resolution for the time resolution search based on a current iteration; and
   using time series alignment to generate the first set of time series data based on the selected time resolution.

7. The method as recited in claim 6, wherein:
   if the current iteration is a first iteration, the selected time resolution is determined to be $B2^{k_{max}}$; and
   if the current iteration is an (i+1)-th iteration for i>0, the selected time resolution is determined to be $B2^{k_{i+1}}$;
   where B is a base integer, $k_{max}$ is a maximum non-negative integer that satisfies $$\frac{\Delta t}{B2^{k_{max}}} \geq 100, k_{i+1} = k_i - 1,$$

and $k_i > 0$.

8. The method as recited in claim 1, wherein performing the time resolution search to automatically generate the time resolution further comprises:
   performing an invariant analysis to generate all-pair invariants from the second set of time series data; and
   determining the time resolution based on the invariant analysis based on a current iteration.

9. The method as recited in claim 8, wherein:
   if the current iteration is a first iteration, the time resolution is determined to be a baseline time resolution $T_1$ used to generate a baseline set of invariants $S_1$; and
   if the current iteration is an (i+1)-th iteration for i>0 associated with a time resolution $T_{i+1}$, another iteration of transforming the data into the second time series data is performed if $T_1$ and $T_{i+1}$ are equivalent and $T_{i+1} > B$, otherwise the time resolution is determined to be $2T_{i+1}$;
   where B is a base integer.

10. A system to automatically generate a set of meta-parameters used to train invariant-based anomaly detectors, comprising:
    a computer system configured to generate data including log data; and a processor operatively coupled to a memory, wherein the processor is configured to:
  obtain the data from the computer system, and transform the obtained data into a first set of time series data and a second set of time series data;
  perform a fitness threshold search based on the first set of time series data to automatically generate a fitness threshold;
  perform a time resolution search on the second set of time series data to automatically generate a time resolution; and
  send, to one or more user devices across a network, a set of meta-parameters including the fitness threshold and the time resolution to govern the training of an invariant-based anomaly detector,
  wherein, in transforming the data into the first set of time series data, the processor is further configured to:
    determine a maximal time resolution for the fitness threshold search; and
    use time series alignment to generate the first set of time series data based on the maximal time resolution;
      wherein the determination of the maximal time resolution comprises, given data spanning from a timestamp $t_1$ to a timestamp $t_2$, a determination of a maximum k such that $$\frac{t_2 - t_1}{B2^k} \geq M,$$

where B is a base integer and M is a user-set minimal number of sample points.

11. The system as recited in claim 10, wherein, in performing the fitness threshold search to automatically generate the fitness threshold, the process is further configured to:
  perform an invariant analysis to generate all-pair invariants from the first set of time series data;
  classify the all-pair invariants into groups based on a fitness of each all-pair invariant, wherein each of the groups has a lower bound defined by a boundary value, and wherein the groups are organized in descending order of fitness such that a first one of the groups has a lower bound defined by a highest boundary value and a last one of the groups has a lower bound defined by a boundary value of zero;
  determine that at least one of the groups, excluding the last group, is non-empty;
  set the fitness threshold to a boundary value corresponding to the non-empty group having the highest boundary value; and
  set the fitness threshold to a given value in response to determining that none of the groups excluding the last group is non-empty.

12. The system as recited in claim 10, wherein, in transforming the data into the second set of time series data, the processor is further configured to:
  determine a selected time resolution for the time resolution search based on a current iteration; and
  use time series alignment to generate the first set of time series data based on the selected time resolution
  wherein:
    if the current iteration is a first iteration, the selected time resolution is determined to be $B2^{k_{max}}$; and
    if the current iteration is an (i+1)-th iteration for i>0, the selected time resolution is determined to be $B2^{k_{i+1}}$;
  where B is a base integer, $k_{max}$ is a maximum non-negative integer that satisfies $$\frac{\Delta t}{B2^{k_{max}}} \geq 100, k_{i+1} = k_i - 1,$$

and $k_i$>0.

13. The system as recited in claim 10, wherein, in performing the time resolution search to automatically generate the time resolution, the processor is further configured to:
  perform an invariant analysis to generate all-pair invariants from the second set of time series data; and
  determine the time resolution based on the invariant analysis based on a current iteration wherein:
    if the current iteration is a first iteration, the time resolution is determined to be a baseline time resolution $T_i$ used to generate a baseline set of invariants $S_1$; and
    if the current iteration is an (i+1)-th iteration for i>0 associated with a time resolution $T_{i+1}$, another iteration of transforming the data into the second time series data is performed if $T_i$ and $T_{i+1}$ are equivalent and $T_{i+1}$>B, otherwise the time resolution is determined to be $2T_{i+1}$;
  where B is a base integer.

14. A computer program product comprising a non-transitory computer readable storage medium having program instructions embodied therewith, the program instructions executable by a computer to cause the computer to perform a method for automatically generating a set of meta-parameters used to train invariant-based anomaly detectors comprising:
  transforming data into a first set of time series data and a second set of time series data;
  performing a fitness threshold search based on the first set of time series data to automatically generate a fitness threshold;
  performing a time resolution search on the second set of time series data to automatically generate a time resolution; and
  send, to one or more user devices across a network, a set of meta-parameters including the fitness threshold and the time resolution to govern the training of an invariant-based anomaly detector,
  wherein, in transforming the data into the first set of time series data, the processor is further configured to:
    determine a maximal time resolution for the fitness threshold search; and
    use time series alignment to generate the first set of time series data based on the maximal time resolution;
    wherein the determination of the maximal time resolution comprises, given data spanning from a timestamp $t_1$ to a timestamp $t_2$, a determination of a maximum k such that $$\frac{t_2 - t_1}{B2^k} \geq M,$$

where B is a base integer and M is a user-set minimal number of sample points.

* * * * *